(12) United States Patent
Hsiao

(10) Patent No.: US 6,565,428 B2
(45) Date of Patent: May 20, 2003

(54) DUCT FLOW-TYPE FAN

(75) Inventor: Ming-Yang Hsiao, Ping-Jen (TW)

(73) Assignee: ElanVital Corporation (TW)

( * ) Notice: Subject to any disclaimer, the term of this patent is extended or adjusted under 35 U.S.C. 154(b) by 0 days.

(21) Appl. No.: 09/916,332

(22) Filed: Jul. 30, 2001

(65) Prior Publication Data

US 2002/0098792 A1 Jul. 25, 2002

(30) Foreign Application Priority Data

Jan. 20, 2001 (TW) ........................................ 90201249 U

(51) Int. Cl.[7] ................................................. H05K 5/00
(52) U.S. Cl. ..................................... 454/184; 55/385.4
(58) Field of Search .......................... 454/184; 361/691, 361/695; 55/385.4, 467, 471, 473

(56) References Cited

U.S. PATENT DOCUMENTS

| | | | | |
|---|---|---|---|---|
| 2,399,384 A | * | 4/1946 | Pross | 454/184 |
| 2,825,500 A | * | 3/1958 | McLean | 454/184 |
| 3,911,953 A | * | 10/1975 | Crombie et al. | 137/595 |
| 4,178,092 A | * | 12/1979 | Yamamoto et al. | 250/324 |
| 5,210,680 A | * | 5/1993 | Scheibler | 165/80.3 |
| 5,562,410 A | * | 10/1996 | Sachs et al. | 361/695 |
| 5,657,641 A | * | 8/1997 | Cunningham et al. | 361/691 |
| 5,876,278 A | * | 3/1999 | Cheng | 361/695 |
| 6,104,607 A | * | 8/2000 | Behl | 165/80.3 |
| 6,400,568 B1 | * | 6/2002 | Kim et al. | 165/104.33 |

* cited by examiner

Primary Examiner—Derek S. Boles
(74) Attorney, Agent, or Firm—Bacon & Thomas

(57) ABSTRACT

A duct flow-type fan comprised of a housing having at least one upper and one lower side walls as well as a laterally oriented air port, a motor, a vane, and a shaft. The vane is fitted onto one end of the shaft, with the other end of the shaft conjoined to and driven by the motor such that vane air current passes through the laterally oriented air port of the housing to cool the heat sink of a computer chip in order to achieve efficient computer chip heat dissipation.

12 Claims, 9 Drawing Sheets

DUCT FLOW-TYPE FAN

BACKGROUND OF THE INVENTION

1) Field of the Invention

The present invention relates to a heat dissipation device, the said heat dissipation device having an effectively reduced industrial computer installation height; as well, the heat dissipation device achieves the efficient heat dissipation of chips in computers.

2) Description of the Prior Art

In a conventional industrial computer heat dissipation device 3, as indicated in FIG. 12, FIG. 13, and FIG. 14, the heat dissipation device 3 is comprised of a duct flow-type fan 30 and a heat sink 40, wherein the duct flow-type fan 30 is equipped with an outer enclosure 37 and, also, the outer enclosure 37 has at its exterior periphery a plurality of insertion holes 35 in raised sections 34, the outer enclosure 37 also supports a motor 36 having a plurality of blades 33, and the said duct flow-type fan 30 has an axially oriented intake port 31 and exhaust port 32; the heat sink 40 has a base 41, with the base 41 having extending upward from one side a plurality of arrayed heat dissipation fins 42, the space in between every two fins 42 constituting a ventilation channel 43; formed horizontally across the center of the fins 42 is a vacant channel 43 (depicted in FIG.13 by the dashed line) and the spatial contiguity of each fin 42 is disrupted at the vacant channel 43.

The duct flow-type fan 30 is fastened onto the fins 42 of the heat sink 40 utilizing a plurality of screws (not shown in the drawings) placed into the insertion holes 35 and the lower extent of the base 41 is installed against chip (not shown in the drawings) to dissipate heat. When the fan 30 is placed in circuit and powered into rotation, an air current from the upper extent is admitted into the intake port 31 of the fan 30 and then blown out of the exhaust port 32 towards the heat sink 40 (see the arrowhead in FIG. 14), passing through the ventilation channels 44 before discharge outside (see the arrowhead in FIG. 13), the resulting air convection absorbing the chip heat source via the fins 42 to achieve the objective of heat dissipation.

However, since intake and exhaust of the duct flow-type fan 30 occurs along a single axial line, the fan 30 requires at its upper extent an appropriate space serving as an air intake height and since the air intake height is one-fourth the horizontal width D of the fan 30 (i.e., D/4, a number lower than this defined value will affect fan air intake efficiency), installation in an industrial computer must take into account the total height H (see FIG. 14) of the heat dissipation device 3, which is the air intake height (D/4) as well as the heights of the fan 30 and the heat sink 40. When utilizing industrial computer height in 1U (1U=4.44 mm), air intake height must be allowed for without having to reduce fan 30 or heat sink 40 height, otherwise chip heat dissipation efficiency will be decreased; furthermore, the fan 30 wind force is blown from the top downward onto the base 41, with the back pressure of the axially oriented wind force resulting in high air current resistance will therefore prevent the generation of the optimal air convection needed for heat dissipation efficiency; to achieve air convection efficiency; and the horizontally oriented open channel 43 formed reduces the heat dissipating area of the fins 42 and subsequently also decreases heat dissipation efficiency.

SUMMARY OF THE INVENTION

The present invention herein provides a duct flow-type fan that comprises of a housing having upper and lower side walls as well as a laterally oriented air port, a motor, a vane, and a shaft; the housing is installed at side of a computer chip heat sink, the motor and vane are respectfully positioned at the front and rear sides of the housing and, also, the axial centers of the motor and the vane are conjoined at the two ends of the shaft; the rotation of the motor revolves the shaft, thereby impelling the vane into rotation such that vane air current travels through the laterally oriented air port to cool the computer chip heat sink and in doing so achieve the objective of computer chip heat dissipation; since the overall height of the duct flow-type fan and heat sink of the present invention herein following assembly is lower than the height of the heat sink and does not require additional air intake height, the low height feature is usable for industrial computer applications (such as personal computers, power supplies, and other limited form factor devices); furthermore, the air convection method of the duct flow-type fan invention herein does not generate back pressure, therefore, the air convection current is optimal and provides for maximum heat dissipation efficiency.

DETAILED DESCRIPTION OF THE INVENTION

Figure 1:
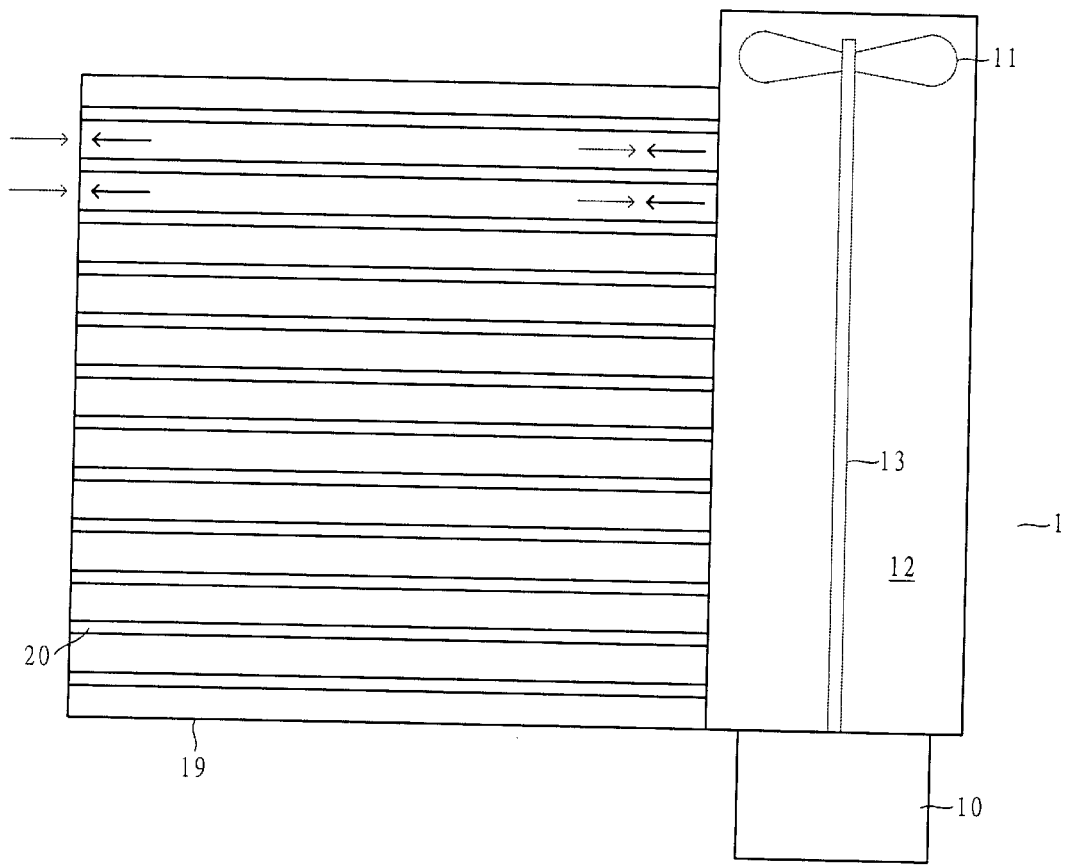
FIG. 1 is a top view of the duct flow-type fan with the heat sink.

As indicated in FIG. 1, FIG. 2, FIG. 3, FIG. 4, and FIG. 5, the duct flow-type fan 1 of the invention herein is comprised of a motor 10, a vane 11, a housing 12, and a shaft 13, wherein the housing 12 having an upper side wall 14, a lower side wall 15, and a right side wall 16 and, also, at least one guide plate 17 is positioned between the upper side wall 14 and the lower side wall 15; the left side wall of the housing 12 serves as an open-type air port 18; the vane 11 is vertically disposed at the rear side of the housing 12, a protective screen 111 and 112 is respectively situated at the front and rear of the vane 11 and, furthermore, the center shaft hole of the vane 11 is fitted over one end of the shaft 13, with the other end of the shaft 13 conjoined to the motor 10 at the front side of the housing 12; in addition to its shielding and air circulation function, the protective screen 111 is utilized to support the shaft 13 and, furthermore, can be additionally equipped with a shaft bearing if required. The vane 11 and the protective screen are not shown in FIG. 2.

Figure 2:
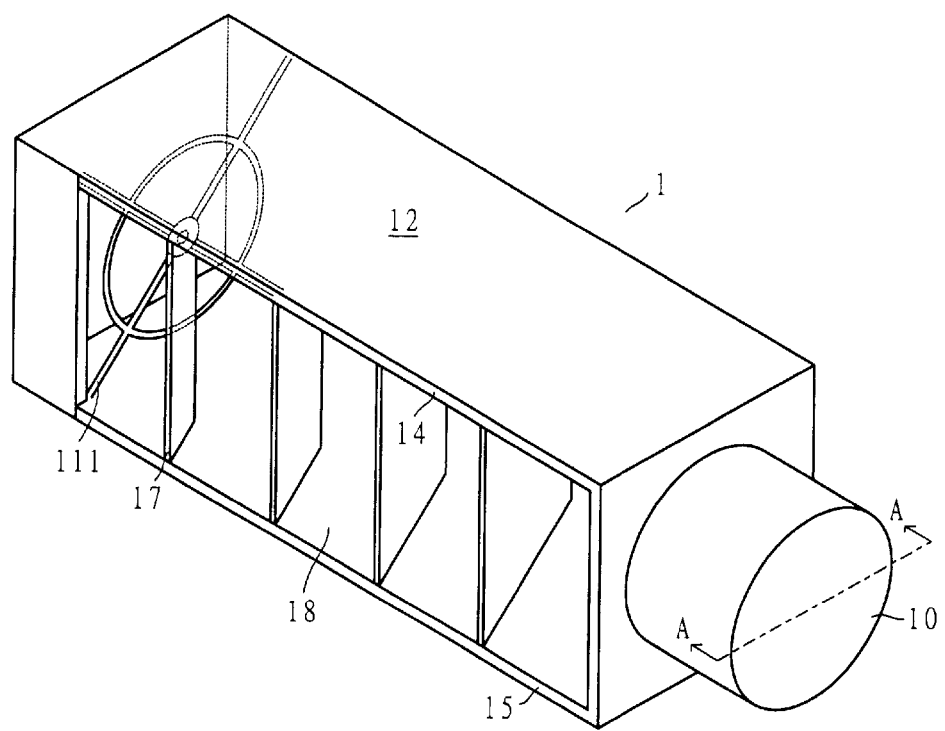
FIG. 2 is an isometric view of the duct flow-type fan.
Figure 3:
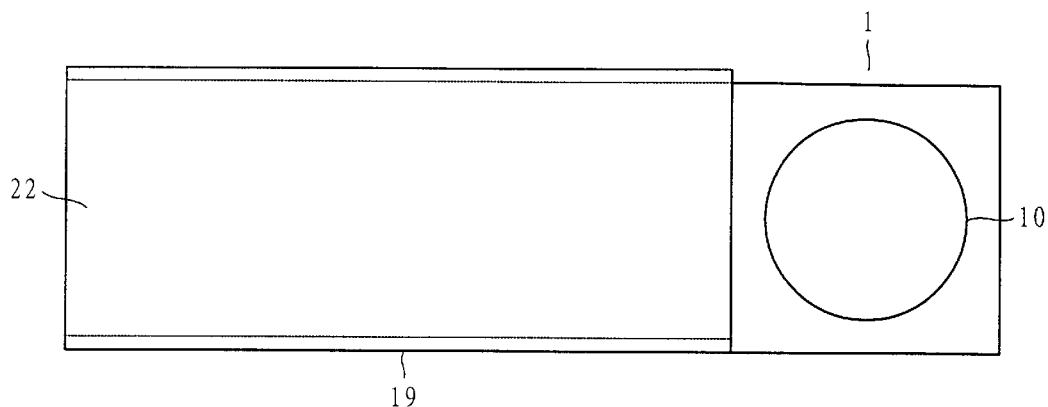
FIG. 3 is a front view of the duct flow-type fan with the heat sink.
Figure 4:
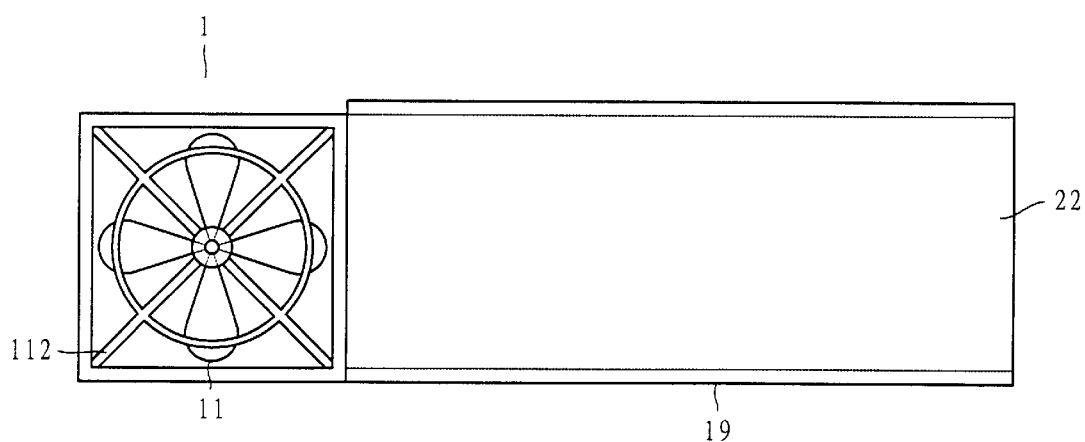
FIG. 4 is a rear view of the duct flow-type fan with the heat sink.
Figure 5:
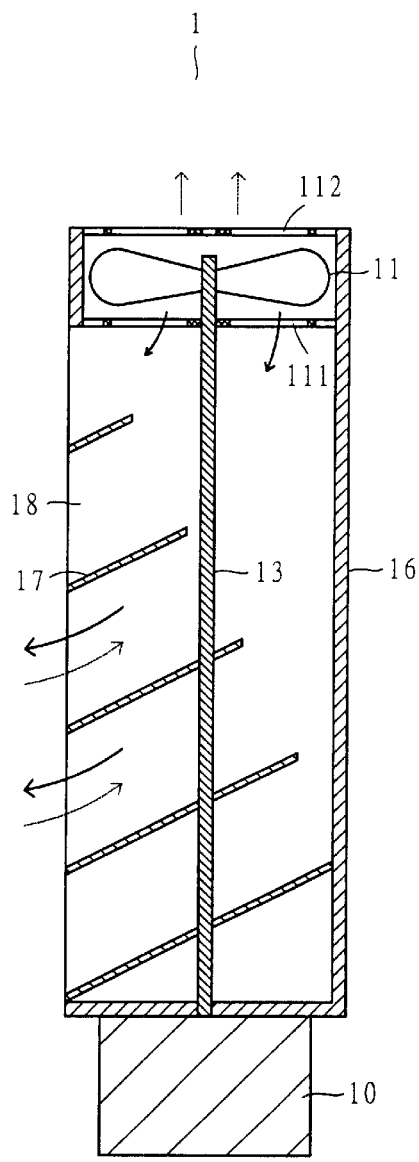
FIG. 5 is a cross-sectional view take along the lines A in FIG. 2.
Figure 6:
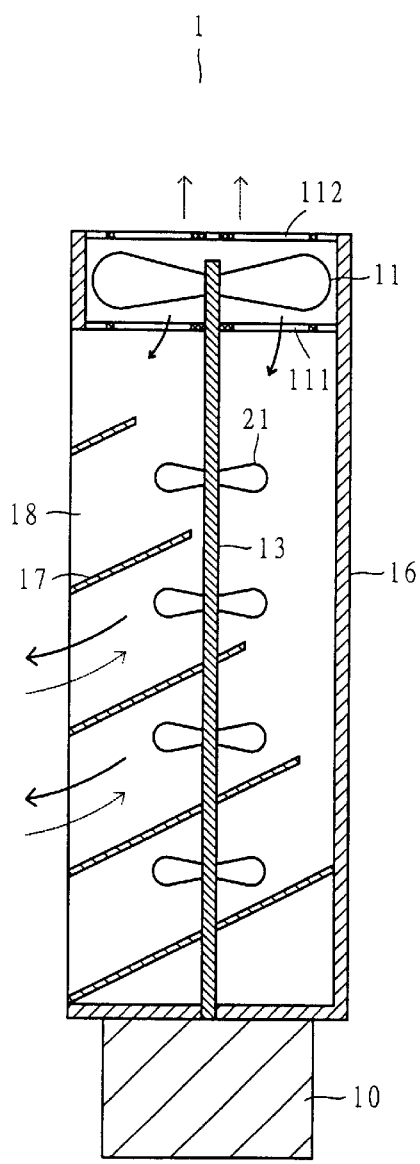
FIG. 6 is a cross-sectional view of the first embodiment of the duct flow-type fan.

Referring to FIG. 1, FIG. 2, and FIG. 5, the duct flow-type fan 1 of the present invention herein consists of a heat sink 19 aligned along the right side (or left side) and, furthermore, heat sink cooling fins 20 that adjoin the air port 18 at the left side of the housing 12; when the motor 10 rotates, it drives the shaft 13 into rotation which then causes the vane 11 to revolve and, as indicated by the arrowheads in the FIG. 1 and FIG. 5, the vane 11 generates an intake of air current from cool air at the rear side that travels pass the guide plate 17 and the air port 18 and is blown towards the heat sink 19, the heat sink 19 thereby achieving the function of heat dissipation; in the present invention herein, the vane 11 can also be rotated in the reverse direction, referring to the arrowhead in FIG. 1 and FIG. 5, such that heated air at the area of the vane 11 flows pass the air port 18 and the guide plate 17 and then is drawn out from the rear side of the vane 11 to achieve the function of heat dissipation similar to that of the said intake method; at the upper extent of the duct flow-type fan 1 and the heat sink 19 assembly structure of the present invention herein, a cover 22 (refer to FIG. 3 and FIG. 4) can also be installed, the cover 22 forcing the cool air current to circulate through the heat sink 19 spaces in order to achieve even greater heat dissipation efficiency. Referring to FIG. 3 and FIG. 4, the overall height of the duct flow-type fan 1 and heat sink 19 of the invention herein following assembly is lower than the height of the heat sink 19 and does not require additional air intake height, the low height feature is practical for industrial computer applications (such as personal computers, power supplies, and other limited form factor devices). Referring to FIG. 6, in the duct flow-type fan 1 of the present invention herein, at least one auxiliary vane 21 can be additionally installed onto the shaft 13 to increase the flow speed of the cool air current, thereby raising the heat dissipation efficiency, which is a feature of the first embodiment of the present invention herein.

In the present invention herein, there are no set limits as to the guide plate 17 height and the height can be configured to produce additional flow direction performance; furthermore, there are no set limits for guide plate 17 extension since the guide plate 17 can be extended downwards from the upper side wall 14, and it can also be extended upward from the lower side wall 15, or extended between the upper side wall 14 and the lower side wall 15; and the guide plate 17 is not solely limited to being planar in shape, other arrangements including curved forms can be use. In FIG. 5 and FIG. 6, no contact friction is produced between the shaft 13 and the guide plates 17, thereby maintaining rotational smoothness.

Figure 7:
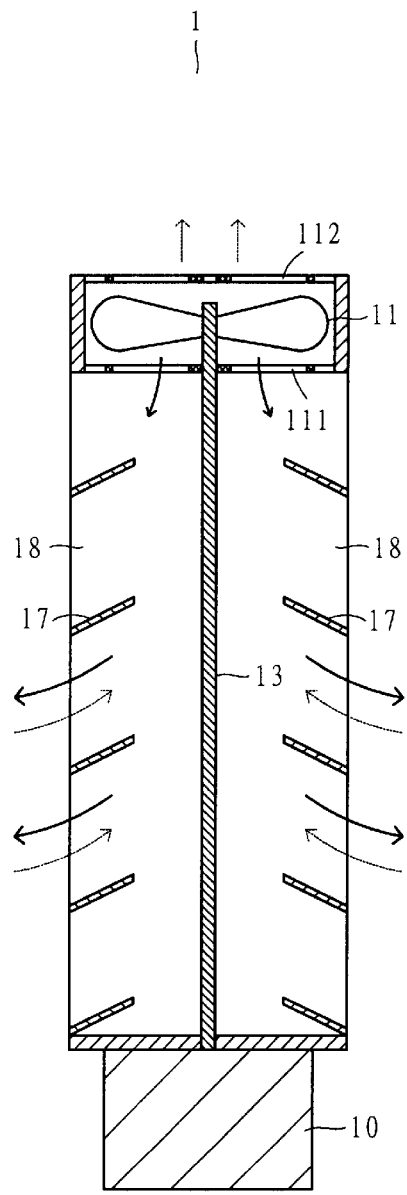
FIG. 7 is a cross-sectional view of the second embodiment of the duct flow-type fan.
Figure 8:
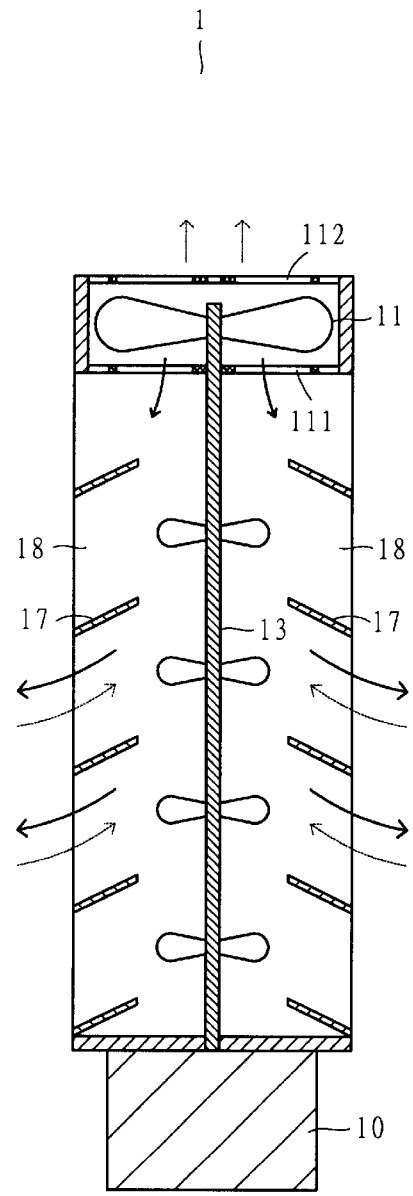
FIG. 8 is a cross-sectional view of the third embodiment of the duct flow-type fan.

Referring to FIG. 7, the duct flow-type fan 1 of the present invention herein includes a design in which there are open-type air ports at the left and the right sides, at least one guide plate 17 is disposed at both the left and the right sides of the shaft 13, and a left and a right heat sink are simultaneously utilized for heat dissipation, which is a feature of the second embodiment of the present invention herein. In FIG. 7, controlling the forward or reverse rotation of the motor 10 results in air current flowing in different directions, as indicated by the solid and invisible lines in FIG. 5. Referring to FIG. 8, the duct flow-type fan 1 of the present invention herein can be of a configuration that combines the embodiments in FIG. 6 and FIG. 7, wherein both the left and the right sides are designed with open-type air ports, at least one guide plate 17 is disposed at both the left and the right sides of the shaft 13 and, at least one auxiliary vane 21 is additionally installed onto the shaft 13 to increase the flow speed of the cool air current, which is a feature of the third embodiment of the present invention herein.

Figure 9:
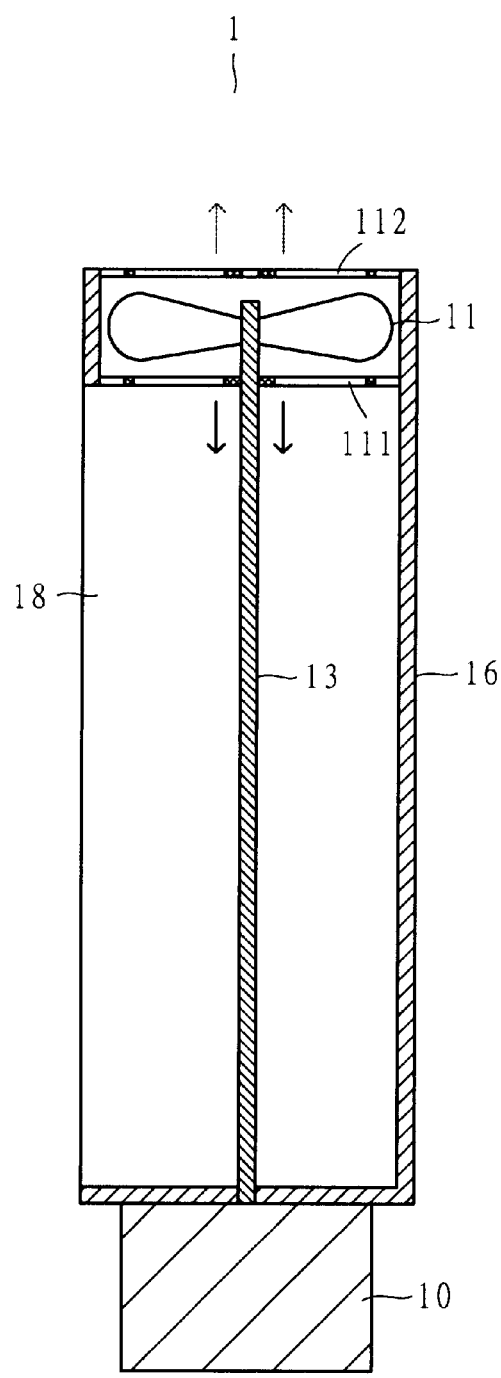
FIG. 9 is a cross-sectional view of the fourth embodiment of the duct flow-type fan.

Referring to FIG. 9, the fourth embodiment of the present invention herein, guide plates 17 are not utilized in the said embodiment and an interference preventing cover plate 22 is disposed between the motor 10 and the housing 12 proximal to its front walls and, of course, the cover plate 22 of the embodiment herein is not subject to any construction material limits, with metal being the most optimal material and, furthermore, its applicability is suitable for any of the arrangements included in the previously described embodiments.

Figure 10:
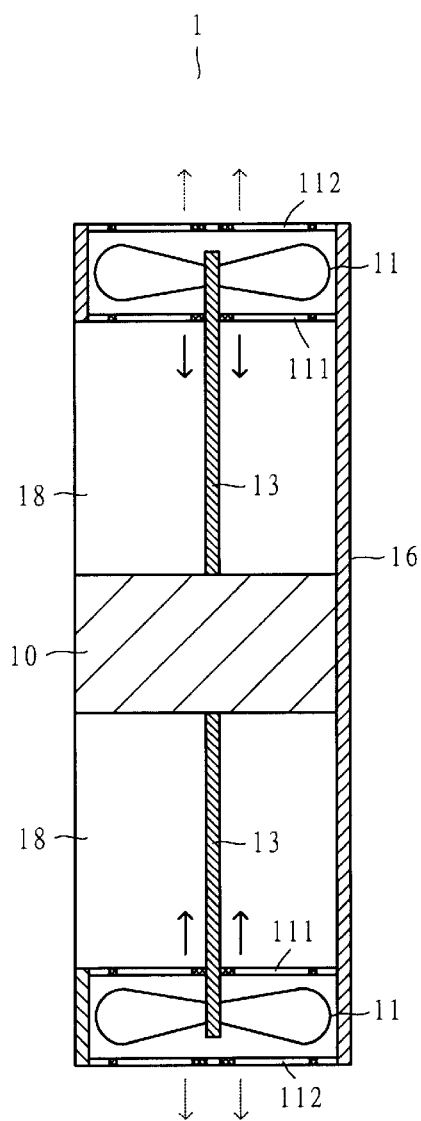
FIG. 10 is a cross-sectional view of the fifth embodiment of the duct flow-type fan.

Another iteration of the duct flow-type fan 1 of the present invention herein, in the fifth embodiment thereof shown in FIG. 10, the motor 10 can be disposed at any position between the front and rear side walls of the housing 12 and, also, the air port 18 is formed in one side and the motor 10 drives the shaft 13 into rotation, with two vanes 11, one at the front and one at the rear, impelled into rotation. Of course, controlling the forward or reverse rotation of the motor 10 also results in air current flowing in different directions, as indicated by the solid and invisible lines in the drawing and, furthermore, at least one auxiliary vane 21 is additionally installed onto the shaft 13, as indicated in FIG. 6, and at least one guide plate 17 is disposed at a single side to augment the cool air current guidance.

Figure 11:
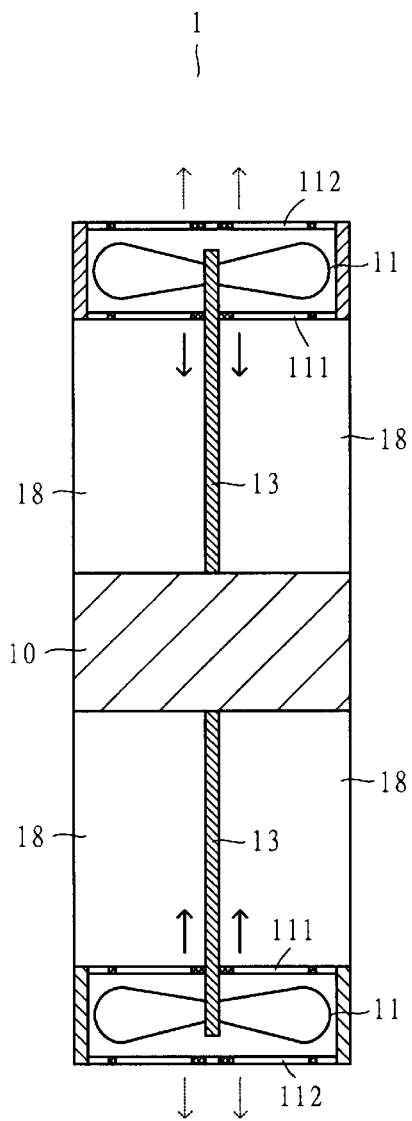
FIG. 11 is a cross-sectional view of the sixth embodiment of the duct flow-type fan.
Figure 12:
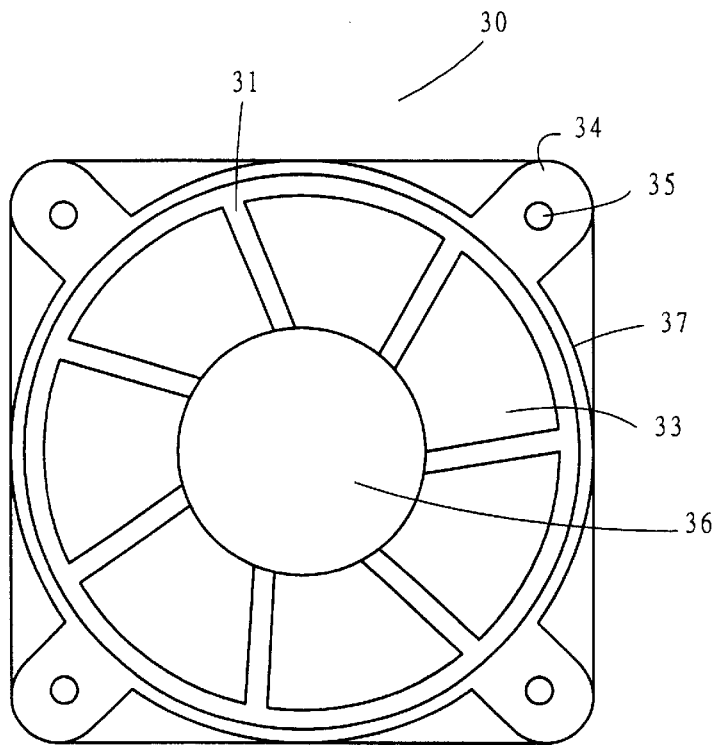
FIG. 12 is a top view of a conventional duct flow-type fan.
Figure 13:
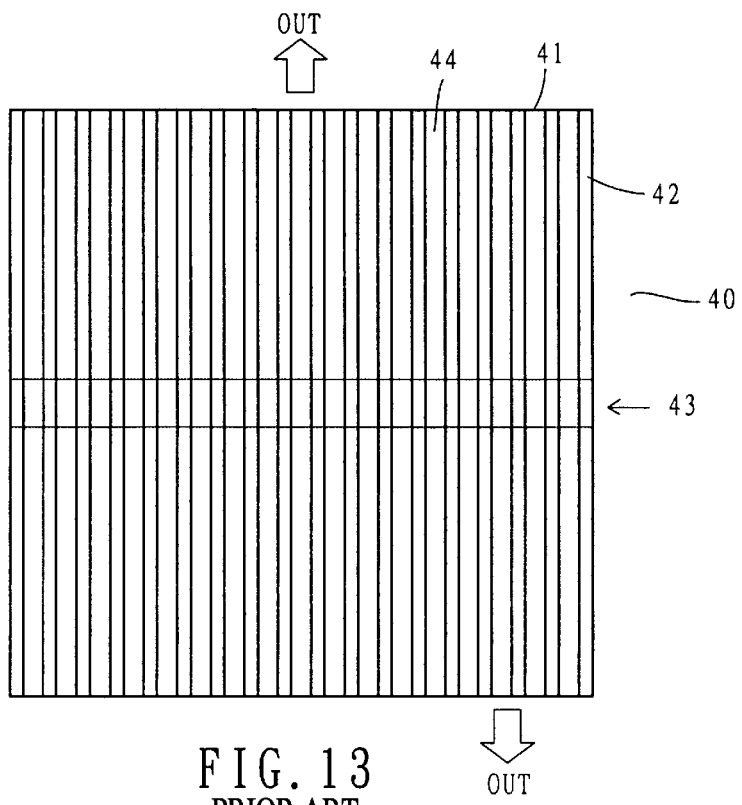
FIG. 13 is a top view of a conventional heat sink.
Figure 14:
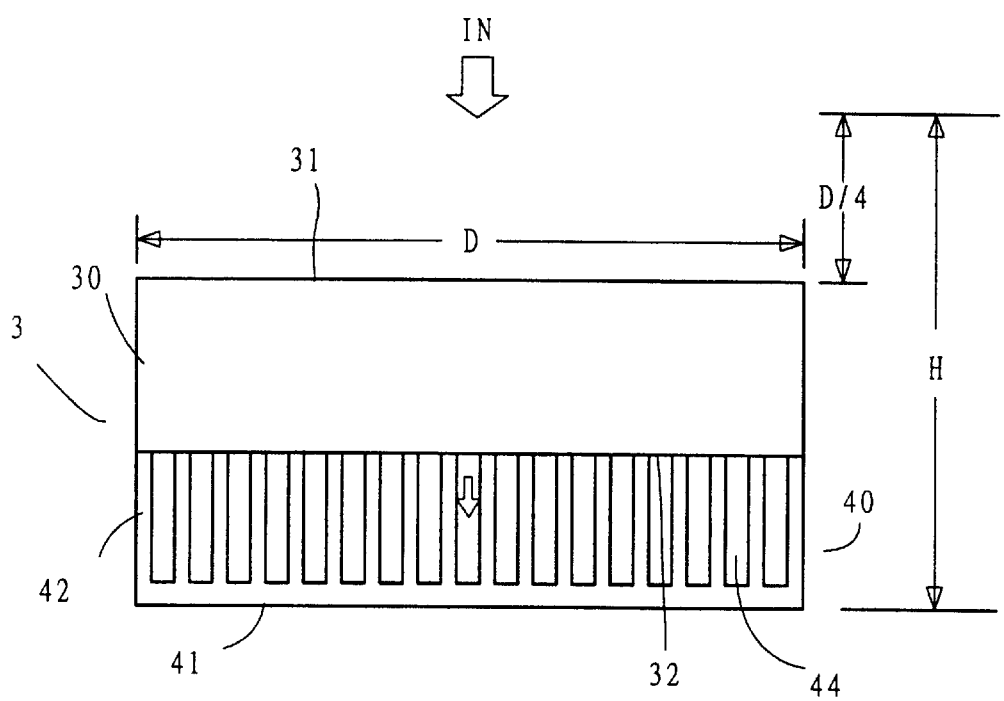
FIG. 14 is a front view of the duct flow-type fan in FIG. 12 installed on the heat sink to form a conventional device.

Yet another iteration of the duct flow-type fan 1 of the present invention herein, in the sixth embodiment thereof shown in FIG. 11, an air port 18 is formed in two sides of the housing 12 and, also, is disposed at any position between the front and rear sides of the housing 12 and the drive motor 10 rotates the shaft 13 as well as two vanes 11, one at the front and one at the rear. Of course, controlling the forward or reverse rotation of the motor 10 will result in air current flowing in different directions, as indicated by the solid and invisible lines in the drawing and, furthermore, at least one auxiliary vane 21 is additionally installed onto the shaft 13, as indicated in FIG. 8, and at least one guide plate 17 is disposed at both sides to augment the cool air current guidance.

Since the overall height of the heat dissipation device is the result/outcome of the assembly of the duct flow-type fan 1 and heat sink 19 of the present invention herein is lower than the height of the heat sink 19, no additional air intake height is required, a feature practical for industrial computer applications (such as personal computers, power supplies, and other limited form factor devices); furthermore, the air convection method of the duct flow-type fan 1 invention herein does not generate back pressure and, therefore, the air convection current is optimal and provides for maximum heat dissipation efficiency.

What is claimed is:

1. A duct flow-type fan comprising:
   a housing comprising an open front side, a rear side, an upper side wall and a lower side wall positioned between the front and rear sides;
   a first air port positioned on a first lateral side of the housing between the upper and lower side walls;
   a propeller-shaped vane positioned at the open front side;
   a shaft secured to the vane, the shaft extending towards the rear side;
   a motor connected to and adapted to rotate the shaft; and
   wherein when the motor is activated, air flows between the open front side and the first air port in a substantially perpendicular direction.

2. The duct flow-type fan of claim 1, wherein the shaft has at least one auxiliary vane installed thereon.

3. The duct flow-type fan of claim 1, wherein the housing further comprises a second air port positioned on a second lateral side of the housing between the upper and lower side walls of the housing.

4. The duct flow-type fan of claim 3, wherein the shaft has at least one auxiliary vane installed thereon.

5. The duct flow-type fan of claims 1 or 2, wherein the housing further comprises at least one guide plate positioned at the first lateral side of the housing and adapted to guide air flow.

6. The duct flow-type fan of claims 3 or 4, wherein the housing further comprising at least two guide plates, respectively positioned at the first and second lateral sides of the housing and adapted to guide air flow.

7. A duct flow-type fan comprising:
   a rectangular housing comprising an open front side, an open rear side, an upper side wall and a lower side wall positioned between the open front and open rear sides;
   a first air port positioned on a first lateral side of the housing between the upper and lower side walls;
   first and second propeller shaped vanes respectively positioned at the open front and open rear sides;
   a motor positioned between the first and second vanes;
   first and second shafts respectively connecting the first and second vanes to the motor, and the motor adapted to rotate the shafts; and
   wherein when the motor is activated, air flows between the open front and rear sides and the first air port in substantially perpendicular directions.

8. The duct flow-type fan of claim 7, wherein the shaft has at least one auxiliary vane installed thereon.

9. The duct flow-type fan of claim 7, wherein the housing further comprises a second air port positioned on a second lateral side of the housing between the upper and lower side walls of the housing.

10. The duct flow-type fan of claim 9, wherein the shaft has at least one auxiliary vane installed thereon.

11. The duct flow-type fan of claims 7 or 8, wherein the housing further comprises at least one guide plate positioned at the first lateral side of the housing and adapted to guide air flow.

12. The duct flow-type fan of claim 9 or 10, wherein the housing at least two guide plates, respectively positioned at the first and second lateral sides of the housing and adapted to guide air flow.

* * * * *